United States Patent
Yamamoto et al.

(10) Patent No.: US 6,819,119 B2
(45) Date of Patent: Nov. 16, 2004

(54) METHOD FOR EVALUATING A CRYSTALLINE SEMICONDUCTOR SUBSTRATE

(75) Inventors: Yoshitsugu Yamamoto, Tokyo (JP); Satoshi Suzuki, Tokyo (JP); Ryo Hattori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 144 days.

(21) Appl. No.: 10/347,412

(22) Filed: Jan. 21, 2003

(65) Prior Publication Data

US 2004/0029390 A1 Feb. 12, 2004

(30) Foreign Application Priority Data

Aug. 6, 2002 (JP) ........................................ 2002-228514

(51) Int. Cl.$^7$ ..................... G01R 27/28; H01L 21/00
(52) U.S. Cl. ............................. 324/616; 438/14
(58) Field of Search ............................. 324/616, 702, 324/158.1; 438/5, 7, 10, 14, 16, 17, 312

(56) References Cited

FOREIGN PATENT DOCUMENTS

| JP | 3-64943 | 3/1991 |
| JP | 8-330320 | 12/1996 |

OTHER PUBLICATIONS

Yamamoto et al., "Transient of electrical and optical characteristics of C–doped HBT structure with minority carrier injection", pre–publication paper, 46$^{th}$ annual meeting of the related association of the Japan Society of Applied Physics (Tokyo Univ. of Science, Mar. 1999), 4 pages.

*Primary Examiner*—Evan Pert
(74) *Attorney, Agent, or Firm*—Leydig, Voit & Mayer, Ltd.

(57) ABSTRACT

In a method for evaluating a crystalline semiconductor substrate which includes a collector layer, a base layer, and an emitter layer and is used for a heterojunction bipolar transistor, a layer is provided having the same composition as the base layer. The semiconductor substrate is irradiated with excitation light and change with time in intensity of photoluminescence from the layer is measured before the intensity becomes saturated. The change with time in current gain of the heterojunction bipolar transistor produced using the semiconductor substrate is determined from the change with time in the intensity.

15 Claims, 8 Drawing Sheets

Related Art

Fig.10 Related Art

METHOD FOR EVALUATING A CRYSTALLINE SEMICONDUCTOR SUBSTRATE

BACKGROUND OF THE INVENTION

1. Field of the Invention

The present invention relates to a method for evaluating a crystalline semiconductor substrate, and more particularly to a method for evaluating a crystalline semiconductor substrate which includes a collector layer, a base layer, and an emitter layer and is used for heterojunction bipolar transistors.

2. Background Art

Heterojunction bipolar transistors (hereinafter referred to as HBTs) are widely used for power amplifiers for portable telephones, etc. since they provide good high-frequency characteristics and high current density. As its emitter-base junction, the HBT employs a heterojunction in which the emitter layer has a band gap larger than that of the base layer to enhance the emitter injection efficiency of the bipolar transistor. A semiconductor device made up of HBTs employs a semiconductor crystal substrate having a multilayer structure.

Figure 9:
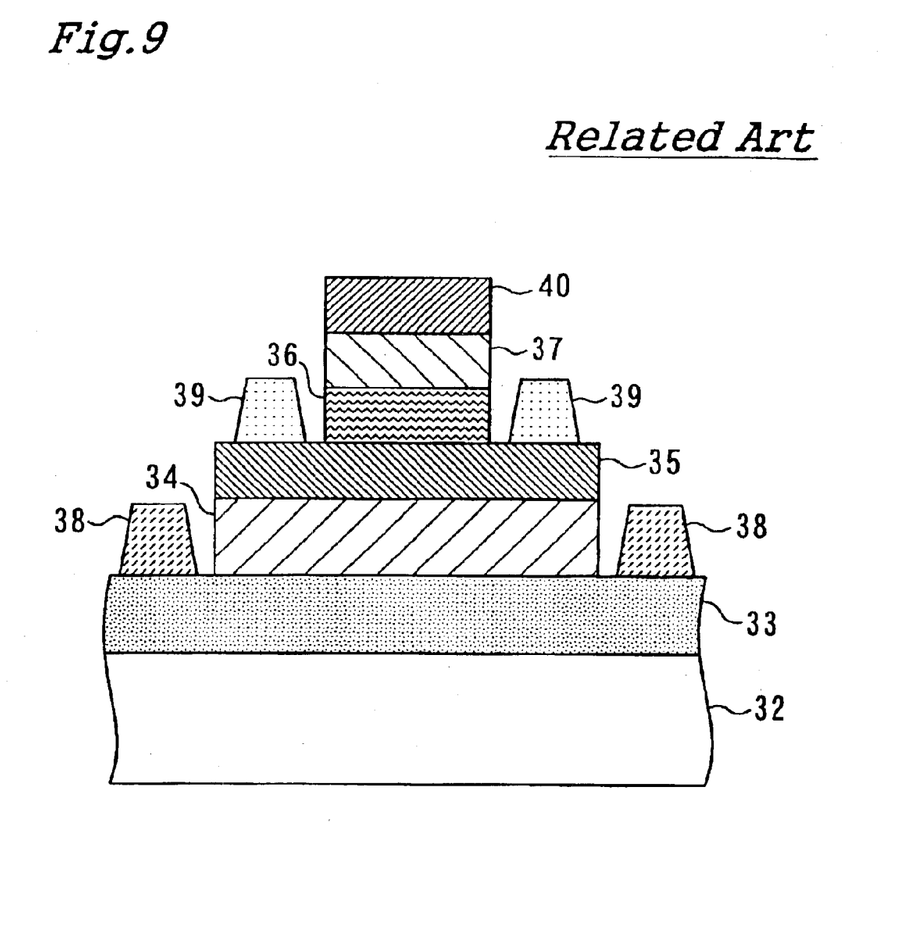
FIG. 9 shows a cross section of a HBT device.

With reference to FIG. 9, a description will be made of a general cross-sectional structure of the semiconductor crystal substrate for HBTs, using an AlGaAs HBT as an example. As shown in the figure, the AlGaAs HBT includes a semiconductive GaAs substrate 32, and an n-GaAs subcollector layer 33, an n-GaAs collector layer 34, a p-GaAs base layer 35, an n-AlGaAs emitter layer 36, and an n-GaAs contact layer 37, which are all formed on the semiconductive GaAs substrate 32 in that order. These layers are formed by epitaxially growing each layer by use of, for example, the metalorganic chemical vapor deposition method (hereinafter referred to as the MOCVD method). Further in FIG. 9, reference numeral 38 denotes collector electrodes; 39 denotes base electrodes; and 40 denotes an emitter electrode. The collector electrodes 38 have a laminated structure made up of, for example, AuGe/Ni/Au. The base electrodes 39, on the other hand, have a laminated structure made up of, for example, Pt/Ti/Au. Furthermore, the emitter electrode 40 is made of, for example, WSiN.

To enhance the high-frequency characteristics of an HBT configured as described above so that its characteristics are sufficient for a microwave device, the base resistance must be reduced by reducing the thickness of the p-type compound semiconductor crystal layer constituting the base layer and increasing the impurity concentration. For example, a known method for reducing the base resistance is to add, as an impurity, carbon to the p-GaAs layer, which is a p-type compound semiconductor crystal layer used as the base layer, in order to increase the carrier concentration of the base layer. In this method, however, hydrogen is undesirably taken into the base layer from ambient atmosphere in the base layer growth process. If hydrogen is included into the base layer, an initial change in the electrical characteristics, especially in the current gain is observed, which is disadvantageous to the quality control. This phenomenon is explained below using a specific example.

Figure 10:
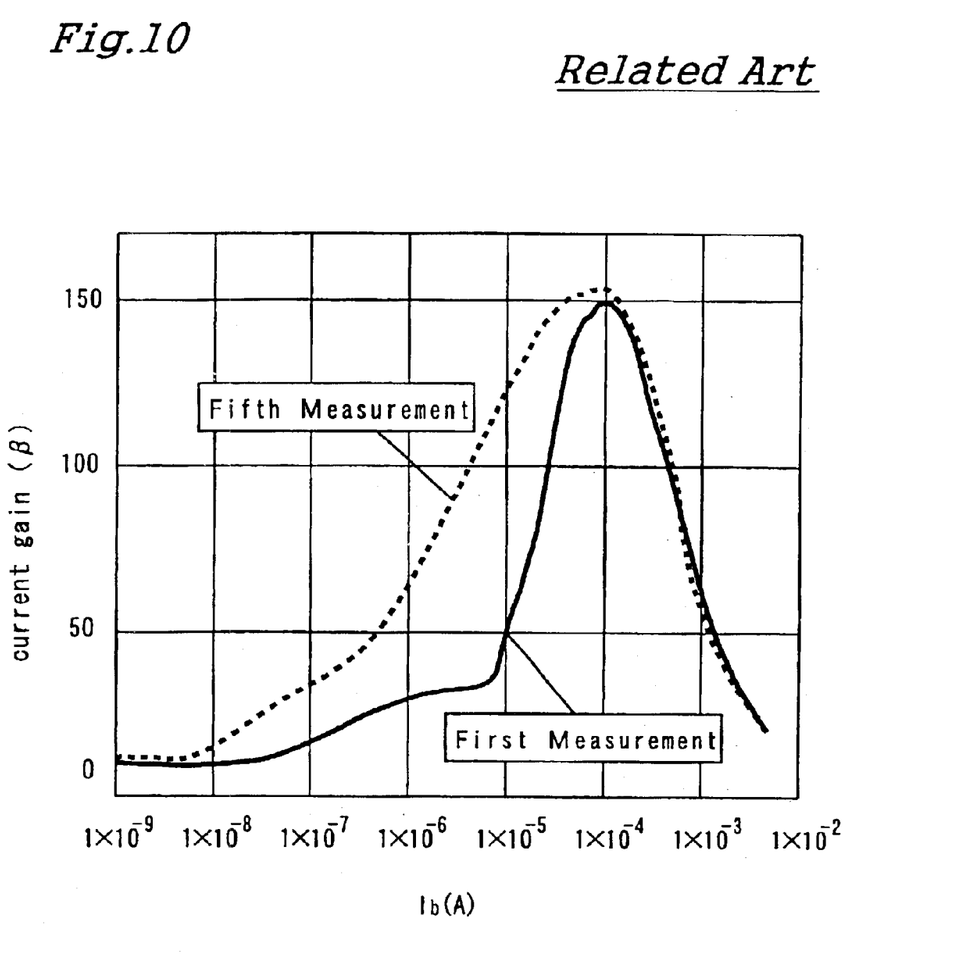
FIG. 10 shows the relationship between a base current and a current gain.

FIG. 10 shows the change in the current gain ($\beta$) of an HBT with changing base current (Ib). The HBT indicated by the figure has a base layer whose carrier concentration and hydrogen concentration are approximately $4 \times 10^{19}$ cm$^{-3}$ and $2 \times 10^{19}$ cm$^{-3}$, respectively. The thickness of the base layer of the HBT is approximately 1,000 Å, and its emitter size is $4 \times 20$ $\mu$m. The change in the current gain ($\beta$) was measured five times on the same conditions. In the figure, the label "First measurement" indicates the characteristic curve measured for the first time immediately after the device was produced, while the label "Fifth measurement" indicates the characteristic curve measured for the fifth time.

As shown in FIG. 10, the current gain ($\beta$) changes with changing base current (Ib). Specifically, when the base current (Ib) is increased, the current gain ($\beta$) increases to a certain value and then decreases. The shapes of the curves of the current gains ($\beta$) measured immediately after energization for the first time and the fifth time are greatly different from each other when the current gains ($\beta$) increase. Specifically, the current gain ($\beta$) increases more rapidly as the number of times the device is energized increases. However, the maximum value of the current gain ($\beta$) measured for the first time is not largely different from that measured for the fifth time. Furthermore, the shapes of the curves obtained when the current gains ($\beta$) decrease are substantially the same.

The occurrence of the phenomenon shown in FIG. 10 that the current gain increases more rapidly with increasing number of energization operations is conceivably attributed to hydrogen included in the base layer of the HBT. That is, inclusion of hydrogen into the base layer of the HBT makes the electrical characteristics of the device extremely unstable, which is disadvantageous to the quality control of the semiconductor device. On the other hand, the change in the current gain with increasing number of energization operations becomes small for the fifth and later measurements, making the characteristics stabilized. However, inspecting the product after its characteristics have become stable takes considerable time, which is not preferable in terms of productivity.

Furthermore, conventionally, it is difficult to measure an initial change in the current gain at the time point when the crystal has been grown. That is, it is not possible to determine the initial change in the current gain until an HBT device is actually manufactured (from the grown crystal) and its electrical characteristics are evaluated. Such characteristics (as the current gain change) of a semiconductor crystal substrate cannot be determined without actually manufacturing an HBT device from it, raising the problem that it is not possible to perform the quality control at stages before the HBT is manufactured from the semiconductor crystal substrate.

SUMMARY OF THE INVENTION

The present invention has been devised in view of the above problems. It is, therefore, an object of the present invention to provide a method for evaluating a semiconductor crystal substrate in such a way that it is possible to estimate the initial change in the current gain of the semiconductor crystal substrate.

Another object of the present invention is to provide a method for evaluating a semiconductor crystal substrate in such a way that it is possible to perform quality control of an HBT device.

Other objects and advantages of the present invention will become apparent from the following description.

According to one aspect of the present invention, in a method for evaluating a semiconductor crystal substrate which includes a collector layer, a base layer, and an emitter layer and is used for a heterojunction bipolar transistor, a semiconductor crystal substrate to be evaluated which includes a crystal layer whose composition is the same as that of the base layer is produced. Excitation light is irradiated to the semiconductor crystal substrate to be evaluated and a change with time in an intensity of photoluminescence from the crystal layer is measured before the intensity becomes saturated. A change with time in a current gain of the heterojunction bipolar transistor produced using the semiconductor crystal substrate is measured based on the change with time in the intensity.

Other and further objects, features and advantages of the invention will appear more fully from the following description.

DETAILED DESCRIPTION OF THE PREFERRED EMBODIMENTS

Preferred embodiments of the present invention will be described below with reference to the accompanying drawings.

Figure 1A:
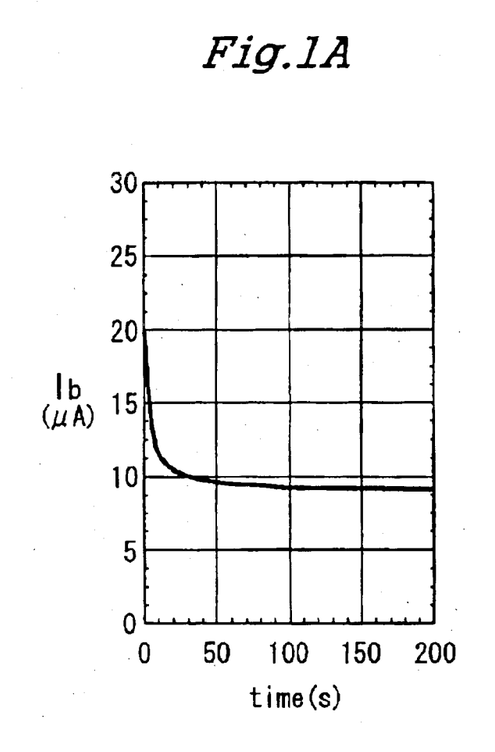
FIG. 1A is a change in a base current with time depending on concentration of hydrogen.
Figure 1B:
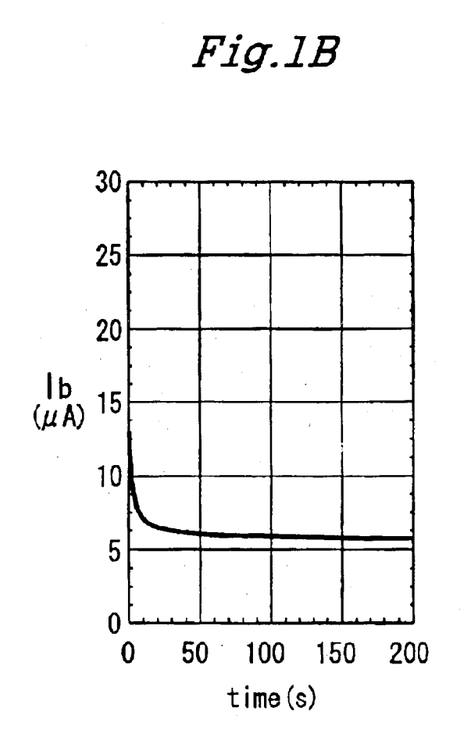
FIG. 1B is a change in a base current with time depending on concentration of hydrogen.
Figure 1C:
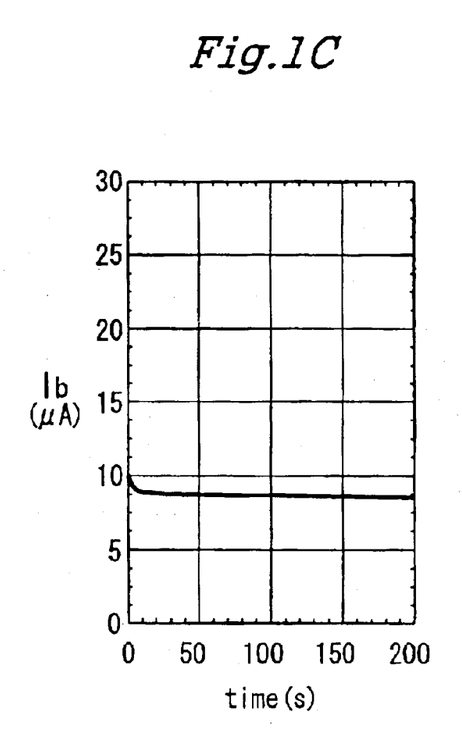
FIG. 1C is a change in a base current with time depending on concentration of hydrogen.

The change in the current gain of an HBT shown in FIG. 10 is related to the hydrogen concentration in the base layer. This relationship will be described in detail with reference to FIG. 1A~FIG. 1C. FIGS. 1A, 1B, and 1C each shows the change in the base current with time. Specifically, FIG. 1A shows the change in the base current with the concentration of the hydrogen contained in the base layer set to $1\times10^{19}$ $cm^{-3}$; FIG. 1B shows the change with the concentration set to $4\times10^{18}$ $cm^{-3}$; and FIG. 1C shows the change with the concentration set to $1\times10^{18}$ $cm^{-3}$. All of the curves shown in FIG. 1A~FIG. 1C were obtained with the collector-emitter voltage and the base-emitter voltage fixed to 2.5V and 1.3V, respectively. As shown in the figures, the higher the hydrogen concentration, the larger the change in the base current with time. The current gain ($\beta$), the base current (Ib), and the collector current (Ic) are related by the following formula, $$\beta=\Delta Ic/\Delta Ib.$$

It should be noted that a similar phenomenon is observed in photoluminescence (hereinafter abbreviated as PL) evaluation, which will be described below in detail.

PL is a light-emitting phenomenon which occurs when minority carries (electrons in the case of a p-type semiconductor) within a semiconductor recombine with holes (or electrons) and thereby form electron-hole pairs after the minority carriers are excited by irradiating to the semiconductor a light having a wavelength with energy larger than the forbidden energy band gap.

Figure 2A:
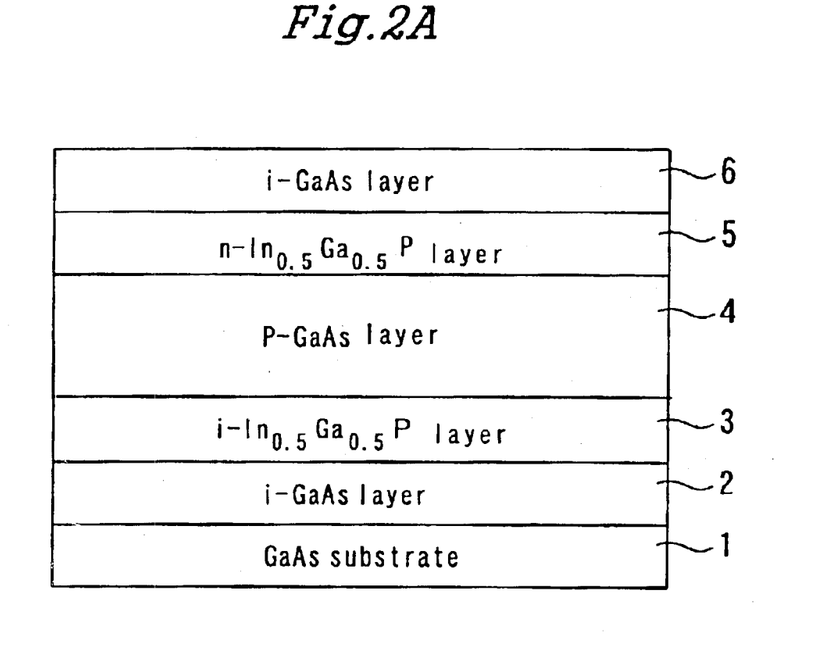
FIG. 2A shows a cross section of a semiconductor substrate used for PL evaluation.
Figure 2B:
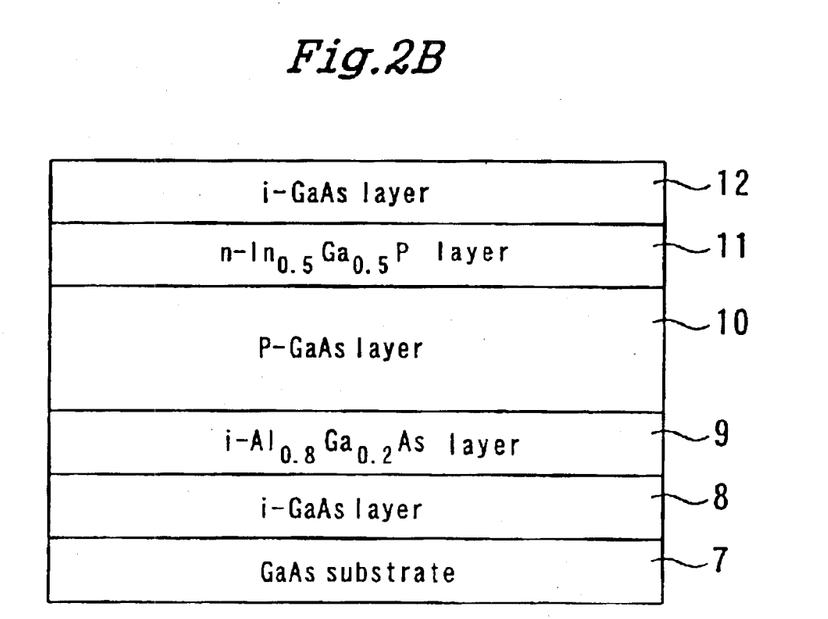
FIG. 2B shows a cross section of a semiconductor substrate used for PL evaluation.

FIGS. 2A and 2B each shows a semiconductor crystal substrate used for PL evaluation. The semiconductor crystal substrate shown in FIG. 2A comprises a GaAs substrate 1, and an i-GaAs layer 2, an i-$In_{0.5}Ga_{0.5}P$ layer 3 (200 Å thick), a C-doped p-GaAs layer 4 (carrier concentration: $4\times10^{19}$ $cm^{-3}$, thickness: 1,000 Å), an n-$In_{0.5}Ga_{0.5}P$ layer 5 (carrier concentration: $3\times10^{17}$ $cm^{-3}$, thickness: 200 Å), and an i-GaAs layer 6 (200 Å thick), which are all formed on the GaAs substrate 1 in that order. The semiconductor crystal substrate shown in FIG. 2B, on the other hand, comprises a GaAs substrate 7, and an i-GaAs layer 8, an i-$In_{0.8}Ga_{0.2}As$ layer 9 (500 Å thick), a C-doped p-GaAs layer 10 (carrier concentration: $4\times10^{19}$ $cm^{-3}$, thickness: 1,000 Å), an n-$In_{0.5}Ga_{0.5}P$ layer 11 (carrier concentration: $3\times10^{17}$ $cm^{-3}$, thickness: 1,000 Å), and an i-GaAs layer 12 (200 Å thick), which are all formed on the GaAs substrate 7 in that order.

In FIGS. 2A and 2B, the p-GaAs layers 4 and 10 in which carbon is doped as a p-type impurity correspond to the base layers of the HBTs. In the semiconductor crystal substrate shown in FIG. 2A (hereinafter referred to as Sample I), the concentration of the hydrogen contained in the p-GaAs layer 4 is $1\times10^{19}$ $cm^{-3}$. In the semiconductor crystal substrate shown in FIG. 2B (hereinafter referred to as Sample II), on the other hand, the concentration of the hydrogen contained in the p-GaAs layer 10 is $4\times10^{18}$ $cm^{-3}$. The impurity concentrations of the p-GaAs layers 4 and 10 in Sample I and Sample II, respectively, are both $4\times10^{19}$ $cm^{-3}$. Furthermore, the thicknesses of the p-GaAs layers 4 and 10 are both approximately 1,000 Å, which is approximately equal to the thicknesses of the base layers of the HBTs.

Figure 3A:
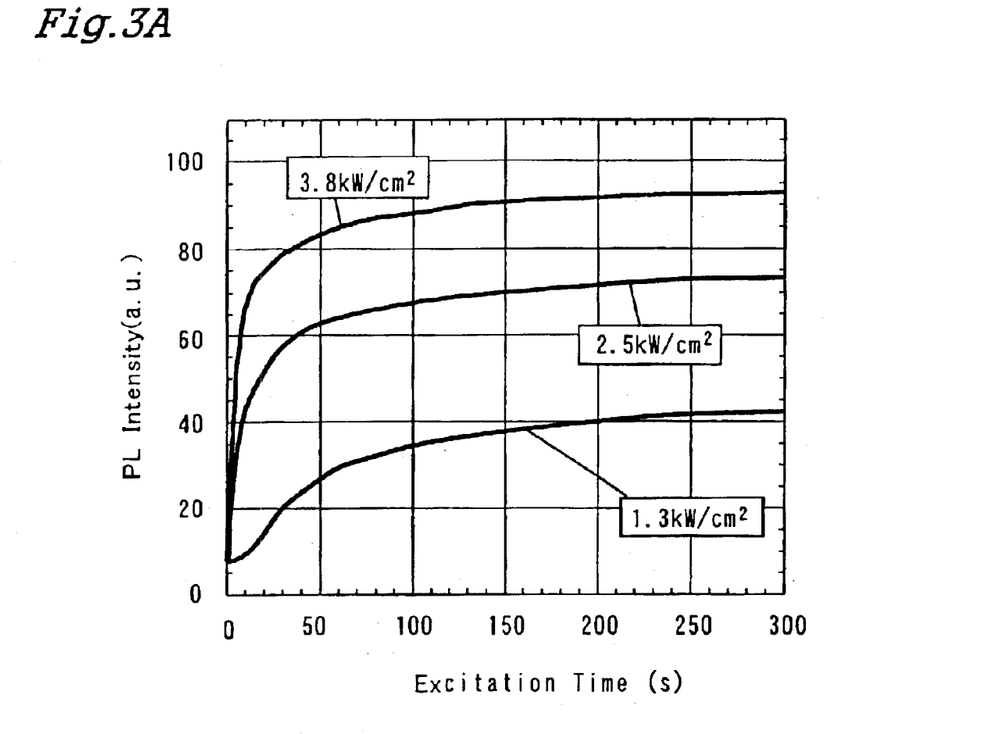
FIG. 3A shows change in PL intensity with time depending on concentration of hydrogen.
Figure 3B:
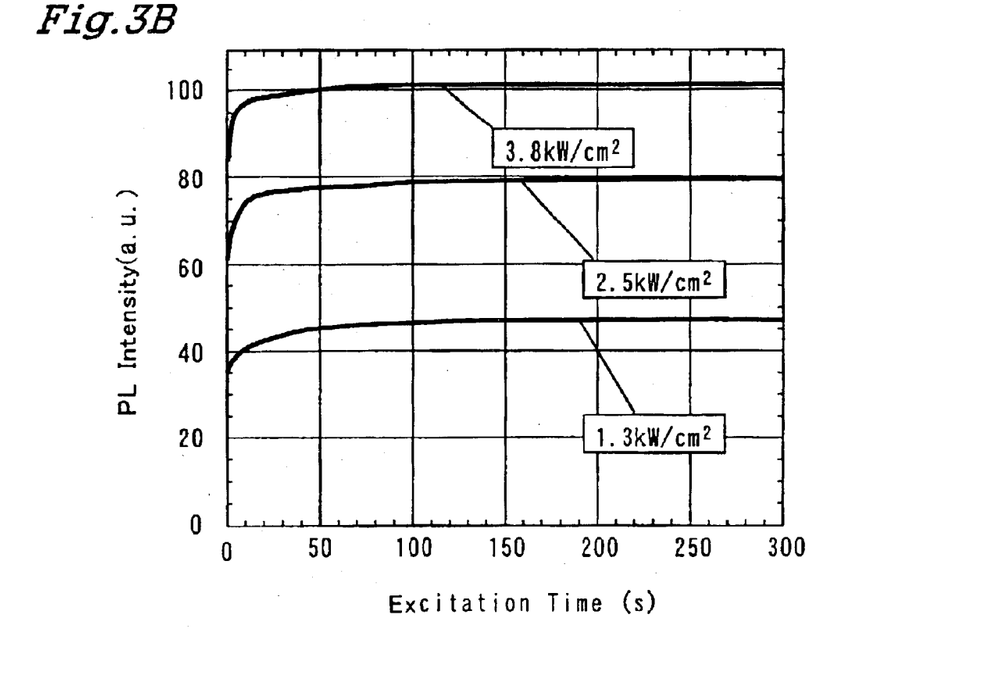
FIG. 3B shows change in PL intensity with time depending on concentration of hydrogen.

FIG. 3A and FIG. 3B show PL intensities measured at room temperature using an Ar ion laser (light) having a wavelength of 488 nm as an excitation light source. FIG. 3A shows PL intensities of Sample I shown in FIG. 2A, while FIG. 3B shows PL intensities of Sample II shown in FIG. 2B. In each figure, the horizontal axis indicates the excitation time, and the vertical axis indicates the PL intensity. In FIG. 3A and FIG. 3B, the PL wavelength is 897 nm, which corresponds to the forbidden energy band gap of GaAs. The value of the PL intensity increases with time and becomes constant from a certain time point, reaching the saturation point. The change in the PL intensity of Sample I from the start of the measurement to the saturation point is larger than that for Sample II. That is, the higher the concentration of the hydrogen contained in the base layer, the longer the time required for the PL intensity to reach its saturation point. Furthermore, regardless of the hydrogen concentration, the PL intensity increases with increasing excitation light intensity.

Figure 4A:
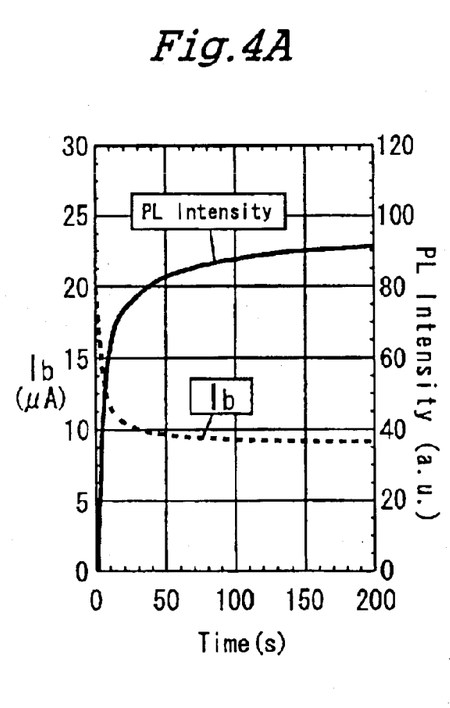
FIG. 4A shows the relationship between base current and PL intensity.
Figure 4B:
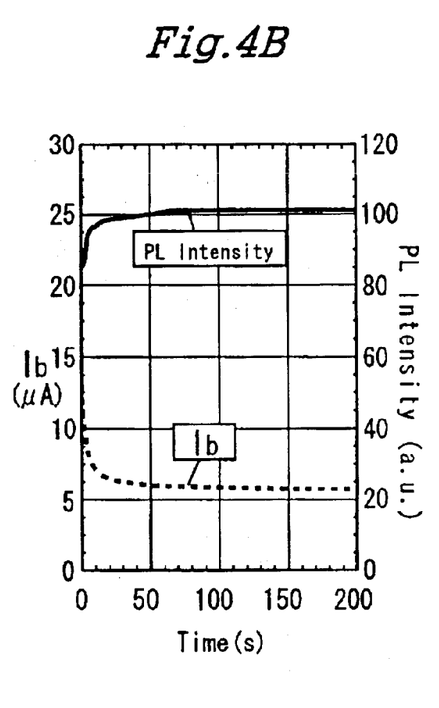
FIG. 4B shows the relationship between base current and PL intensity.
Figure 4C:
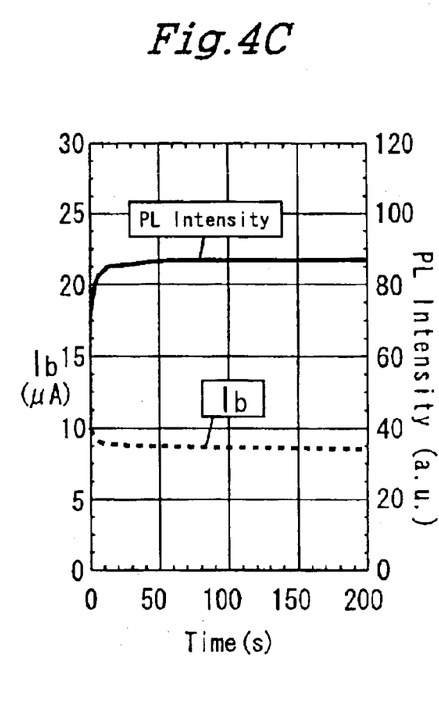
FIG. 4C shows the relationship between base current and PL intensity.

A description will be made below of the relationship between the base current and the PL intensity. FIGS. 4A, 4B, and 4C each shows the time dependences of the base current and the PL intensity of a semiconductor crystal substrate whose base layer has a different hydrogen concentration. Specifically, FIG. 4A shows the time dependences of the base current and the PL intensity with the hydrogen concentration set to $1\times10^{19}$ cm$^{-3}$; FIG. 4B shows the time dependences with the hydrogen concentration set to $4\times10^{18}$ cm$^{-3}$; and FIG. 4C shows the time dependences with the hydrogen concentration set to $1\times10^{18}$ cm$^{-3}$. Furthermore, the base currents are measured with the collector-emitter voltage and the base-emitter voltage fixed to 2.5 V and 1.3 V, respectively. The PL intensities, on the other hand, are measured at room temperature with the excitation light intensity set to approximately 3.8 kW/cm$^2$ using an Ar ion laser (light) having a wavelength of 488 nm. The changes in the intensity of the PL wavelength ($\lambda$=897) were plotted. As shown in the figures, as the concentration of the hydrogen contained in the base layer becomes higher, the changes in the base current and in the PL intensity increase and the time required for the base current and the PL intensity to saturate also increases. Therefore, the change in the PL intensity of a semiconductor crystal substrate over time can be measured to determine the change in the base current over time, that is, the change in the current gain of the HBT device over time.

Incidentally, the hydrogen concentration of the base layer of an HBT is decided by the base layer growth conditions. Therefore, the PL intensity may be measured before actually manufacturing the device, and the base layer growth conditions may be determined based on the measurements to control the quality of the device. Conventionally, a device is actually produced to measure its base current. The production of the device takes at least approximately half a day. The quality control by use of the above PL intensity measurement, on the other hand, does not require the production of the device, and furthermore the PL intensity measurement itself takes only a few minutes, which leads to a significant reduction in the entire working hours. Furthermore, the present invention inspects a semiconductor crystal substrate instead of the actual HBT device, making it possible to carry out nondestructive inspection of the HBT device to measure its electrical properties.

For example, assume that the PL intensity of a semiconductor crystal substrate is measured with an excitation light intensity of 3.8 kW/cm$^2$ using an Ar laser (light) having an excitation wavelength of 488 nm. Letting the PL saturation intensity value (the value of the PL intensity when it no longer changes with time in FIG. 3A~3B, or FIGS. 4A~4C) be 1, if the value of the measured PL intensity reaches 0.95 or more within 50 seconds from the start of the measurement, the initial change in the current gain will be within 5%, which means that the semiconductor crystal substrate is suitable for manufacture of a device.

It should be noted that the relationship between the current gain and the PL intensity of an HBT is described in Japanese Patent Application Laid-open No. Hei 3-64943. The patent utilizes the correlations among the PL intensity, the carrier lifetime, and the current gain, and measures the lifetime of the PL after the saturation of the PL intensity in order to measure the lifetime of the carriers in the base layer. However, the lifetime of PL is generally on the order of a few tens of picoseconds. This means that the above literature only measures such a short time to obtain the lifetime of specific PL (and the lifetime of the carriers in the base layer).

The present invention, on the other hand, is characterized in that it utilizes the correlations among the current gain change, the base current change, and the PL intensity change over time. Specifically, the present invention aims to measure how the PL intensity (which indicates the lifetime of the PL) changes in units of a few tens of seconds before its saturation, instead of measuring the lifetime of the PL itself after the saturation of the PL intensity. Therefore, there is no need for measuring time-resolved PL on the order of picoseconds; it is only necessary to monitor the change in the PL intensity with time on the order of seconds.

First Embodiment

Figure 5:
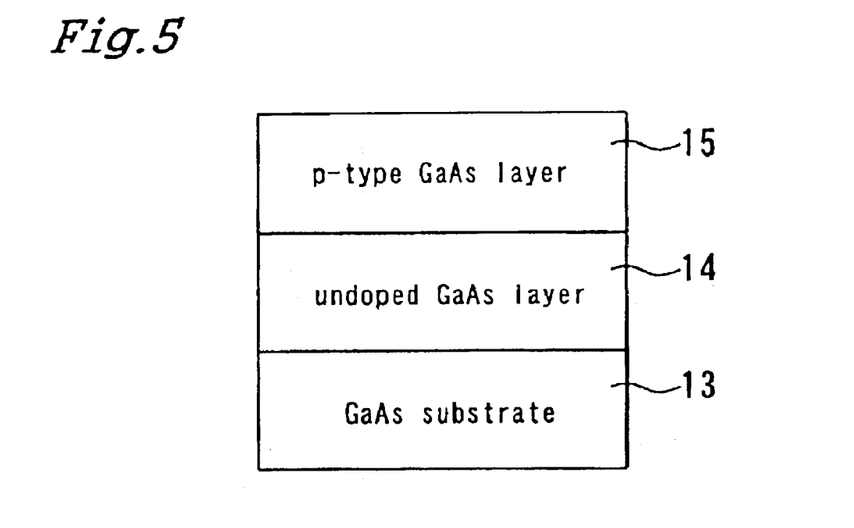
FIG. 5 shows a cross section of a semiconductor crystal substrate according to the first embodiment.

The present embodiment characteristically uses the semiconductor crystal substrate shown in FIG. 5 as a sample and measures its PL intensity. It should be noted that the term "sample" hereinafter indicates a semiconductor crystal substrate to be evaluated. A semiconductor crystal substrate to be evaluated includes a crystal layer corresponding to a base layer used for manufacturing an actual HBT.

In an actual HBT, since the emitter layer, the contact layer, etc. are formed on the base layer, PL emitted from the base layer is absorbed by these layers and as a result, PL of a low intensity can be only observed. To solve this problem, the present invention uses a sample made up of a GaAs substrate 13, an undoped GaAs layer 14, and a p-GaAs layer 15 doped with carbon as a p-type impurity. The undoped GaAs layer 14 and the p-GaAs layer 15 are formed on the GaAs substrate 13 in that order. Alternatively, the p-GaAs layer 15 may be directly formed on the GaAs substrate 13. In the present embodiment, the p-GaAs layer 15 corresponds to the base layer of the HBT, and light emitted from this layer is observed to measure the time dependence of the PL intensity. Since the present invention does not form any other layer on the layer corresponding to the base layer, it is possible to reduce the absorption of PL by other layers, resulting in measurement with sufficient intensity. Furthermore, since the configuration of the sample is very simple, it can be easily produced at low cost.

A sample of the present embodiment can be produced, for example, through epitaxial growth using the MOCVD method. The carrier concentration of the p-GaAs layer 15 is preferably set to approximately from $1\times10^{18}$ cm$^{-3}$ to $1\times10^{20}$ cm$^{-3}$. Its thickness is preferably set to approximately from 500 Å to 10,000 Å. A thickness thinner than 500 Å results in low PL intensity, while a thickness thicker than 10,000 Å leads to high cost. Both cases are undesirable.

The wavelength ($\lambda$) of excitation light used for the PL measurement is preferably set to from 300 nm to 550 nm. For example, an Ar ion laser (light) having a wavelength of 488 nm may be used for the measurement. On the other hand, since the main wavelength ($\lambda$) of PL at room temperature (25° C.) is from 890 nm to 900 nm, it is desirable to use this wavelength to monitor the PL intensity.

Second Embodiment

Figure 6:
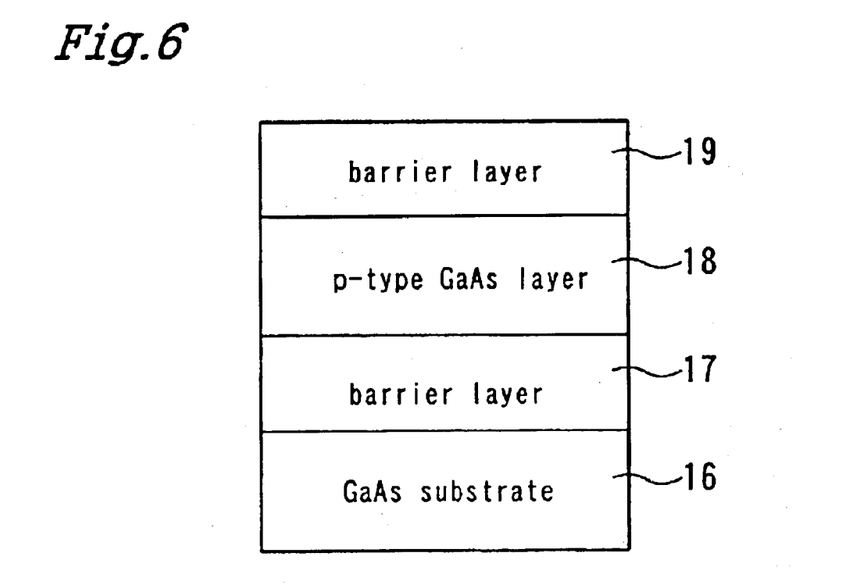
FIG. 6 shows across section of a semiconductor crystal substrate according to the second embodiment.

The present embodiment characteristically uses the semiconductor crystal substrate shown in FIG. 6 as a sample and measures its PL intensity. A p-GaAs layer 18 doped with carbon as a p-type impurity corresponds to the base layer of the HBT. The present invention is characterized in that barrier layers 19 and 17 are formed over and under the p-GaAs layer 18, respectively. As used herein, the term "barrier layer" is a layer which functions to confine excited minority carriers and thereby increase the PL intensity. A material to be used for a barrier layer must have a forbidden energy band gap larger than that of the p-GaAs layer. That is, another semiconductor layer having a forbidden energy band gap larger than that of the p-GaAs layer is bonded to each of the top and the bottom surfaces of the p-GaAs layer so that an energy barrier can be formed due to the difference between these forbidden energy band gaps. The formation of this energy barrier makes it difficult for the carriers within the p-GaAs layer (that is, the electrons and holes) to leave the layer, confining them therein. With this arrangement, the electrons and the holes in the base later can be efficiently recombined together, making it possible to increase the PL intensity.

Materials such as $In_{0.5}Ga_{0.5}P$ and $Al_{0.3}Ga_{0.7}As$ can be used for the barrier layers for the present embodiment. These materials may be doped or undoped. Further, the barrier layers formed over and under the p-GaAs layer may be made of the same material or different materials. Still further, barrier layers need not be formed both over and under the p-GaAS layer. A barrier layer may be formed only either over or under the p-GaAs layer.

A sample of the present embodiment can be produced, for example, through epitaxial growth using the MOCVD method. The carrier concentration of the p-GaAs layer 18 is preferably set to approximately from $1 \times 10^{18}$ $cm^{-3}$ to $1 \times 10^{20}$ $cm^{-3}$. Its thickness is preferably set to approximately from 500 Å to 10,000 Å. A thickness thinner than 500 Å results in low PL intensity, while a thickness thicker than 10,000 Å leads to high cost. Both cases are undesirable.

Unlike the first embodiment, the present embodiment is characterized in that the barrier layers 19 and 17 are formed over and under the p-GaAs layer 18, respectively. Therefore, the thicknesses of the barrier layers 17 and 19 are preferably each set to approximately from 100 Å to 1,000 Å to reduce the absorption by the barrier layers 17 and 19 of PL emitted from the p-GaAs layer 18.

The wavelength (λ) of excitation light used for the PL measurement is preferably set to from 300 nm to 550 nm. For example, an Ar ion laser (light) having a wavelength of 488 nm may be used for the measurement. On the other hand, since the main wavelength (λ) of PL at room temperature (25° C.) is from 890 nm to 900 nm, it is desirable to use this wavelength to monitor the PL intensity.

Third Embodiment

Figure 7:
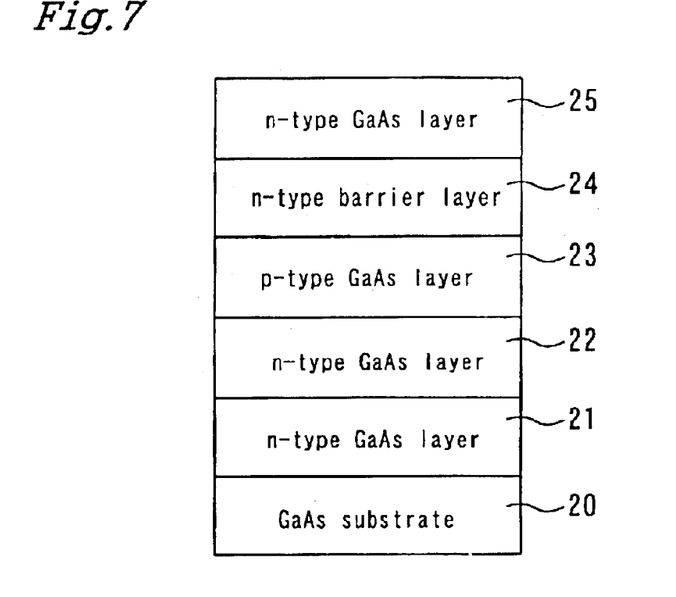
FIG. 7 shows across section of a semiconductor crystal substrate according to the third embodiment.

The present embodiment characteristically uses the semiconductor crystal substrate shown in FIG. 7 as a sample and measures its PL intensity. That is, the present embodiment is characterized in that it measures a sample having the same configuration as that of the semiconductor crystal substrate constituting an actual HBT. Therefore, according to the present embodiment, a sample HBT device can be actually produced from a measured sample (semiconductor crystal substrate), making it possible to obtain accurate information on the electrical characteristics of an HBT device to be produced by using the semiconductor crystal substrate beforehand. Furthermore, since the formation of the base layer of an actual HBT is affected by lattice defects in the crystal layers formed under the base layer, the use of a sample according to the present embodiment having the same configuration as that of an actual semiconductor crystal substrate makes it possible to carry out more accurate evaluation.

As shown in FIG. 7, a semiconductor crystal substrate according to the present embodiment comprises a GaAs substrate 20, and an $n^+$-GaAs layer 21, an n-GaAs layer 22, a p-GaAs layer 23, an n-barrier layer 24, and an n-GaAs layer 25, which are all formed on the GaAs substrate 20 in that order. The p-GaAs layer 23 is doped with carbon as a p-type impurity. These layers can be formed through epitaxial growth using the MOCVD method. The carrier concentration of the p-GaAs layer 23 is preferably set to from $1 \times 10^{18}$ $cm^{-3}$ to $1 \times 10^{20}$ $cm^{-3}$, and its thickness is preferably set to approximately from 500 Å to 10,000 Å. A thickness thinner than 500 Å results in low PL intensity, while a thickness thicker than 10,000 Å leads to high cost. Both the cases are undesirable. On the other hand, the carrier concentration of the $n^+$-GaAs layer 21 is preferably set to $1 \times 10^{18}$ $cm^{-3}$ or more, and its thickness is preferably set to 500 Å or less. Materials such as $In_{0.5}Ga_{0.5}P$ and $Al_{0.3}Ga_{0.7}As$ can be used for the n-barrier layer 24. The carrier concentration of the n-barrier layer 24 is preferably set to from $1 \times 10^{17}$ $cm^{-3}$ to $5 \times 10^{17}$ $cm^{-3}$, and its thickness is preferably set to approximately from 100 Å to 500 Å. Furthermore, the carrier concentrations of the n-GaAs layers 22 and 25 are preferably set to $1 \times 10^{17}$ $cm^{-3}$ or less, and their thicknesses are preferably set to 2,000 Å or more.

The wavelength (λ) of excitation light used for the PL measurement is preferably set to from 300 nm to 550 nm. For example, an Ar ion laser (light) having a wavelength of 488 nm may be used for the measurement. On the other hand, since the main wavelength (λ) of PL at room temperature (25° C.) is from 890 nm to 900 nm, it is desirable to use this wavelength to monitor the PL intensity.

Fourth Embodiment

Figure 8:
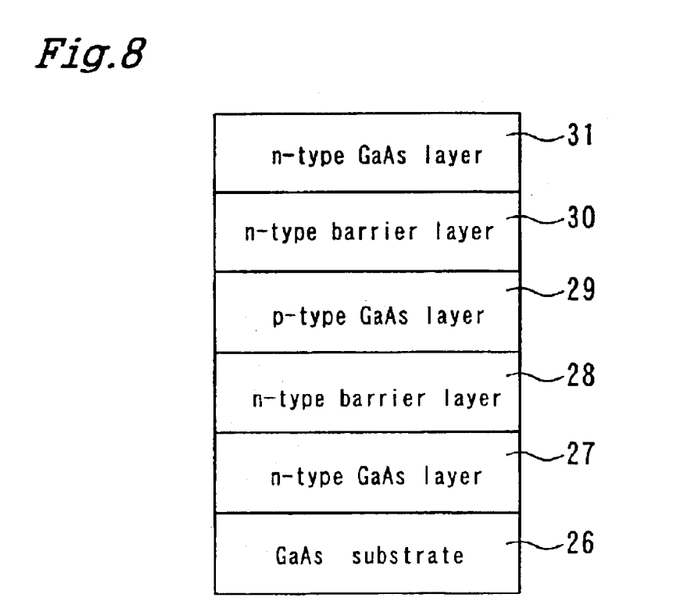
FIG. 8 shows across section of a semiconductor crystal substrate according to the fourth embodiment.

The present embodiment characteristically uses the semiconductor crystal substrate shown in FIG. 8 as a sample and measures its PL intensity. A p-GaAs layer 29 doped with carbon as a p-type impurity corresponds to the base layer of the HBT. The present invention is characterized in that a barrier layer 28 is formed under the p-GaAs layer 29. A material to be used for a barrier layer must have a forbidden energy band gap larger than that of the p-GaAs layer. With this arrangement, an energy barrier is produced due to the difference between these forbidden energy band gaps, making it possible to confine the carriers within the base layer so that the electrons and the holes can be efficiently recombined together, increasing the intensity of PL from the base layer.

Further, since the configuration of the sample (semiconductor crystal substrate) of the present embodiment is similar to that of the semiconductor crystal substrate of an actual HBT device, it is possible to obtain accurate information on the electrical characteristics of the actual HBT device to be produced by using the sample semiconductor crystal substrate beforehand. Furthermore, since the formation of the base layer of the actual HBT is affected by lattice defects in the crystal layers formed under the base layer, the present embodiment makes it possible to carry out more accurate evaluation also in this respect.

As shown in FIG. 8, a semiconductor crystal substrate according to the present embodiment comprises a GaAs substrate 26, and an $n^+$-GaAs layer 27, an n-barrier layer 28, a p-GaAs layer 29, an n-barrier layer 30, and an n-GaAs layer 31, which are all formed on the GaAs substrate 26 in that order. The p-GaAs layer 29 is doped with carbon as a p-type impurity. These layers can be formed through epitaxial growth using the MOCVD method. The carrier concentration of the p-GaAs layer 29 is preferably set to approximately from $1 \times 10^{18}$ $cm^{-3}$ to $1 \times 10^{20}$ $cm^{-3}$, and its thickness is preferably set to approximately from 500 Å to 10,000 Å. A thickness thinner than 500 Å results in low PL intensity, while a thickness thicker than 10,000 Å leads to high cost. Both the cases are undesirable. On the other hand, the carrier concentration of the $n^+$-GaAs layer 27 is preferably set to $1 \times 10^{18}$ $cm^{-3}$ or more, and its thickness is preferably set to 500 Å or less. Furthermore, the carrier concentration of the n-GaAs layers 28 and 31 are preferably set to $1 \times 10^{17}$ $cm^{-3}$ or less, and their thicknesses are preferably set to 2,000 Å or more.

Materials such as $In_{0.5}Ga_{0.5}P$ and $Al_{0.3}Ga_{0.7}As$ can be used for the barrier layers for the present embodiment. The barrier layers formed over and under the C-doped GaAs layer may be made of the same material or different materials. Further, the carrier concentrations of the barrier layers are preferably set to from $1\times10^{17}$ cm$^{-3}$ to $5\times10^{17}$ cm$^{-3}$, and their thicknesses are preferably set to approximately from 100 Å to 500 Å.

The wavelength (λ) of excitation light used for the PL measurement is preferably set to from 300 nm to 550 nm. For example, an Ar ion laser (light) having a wavelength of 488 nm may be used for the measurement. On the other hand, since the main wavelength (λ) of PL at room temperature (25° C.) is from 890 nm to 900 nm, it is desirable to use this wavelength to monitor the PL intensity.

The features and advantages of the present invention may be summarized as follows.

According to one aspect, it is possible to determine the change in the base current of an HBT with time, that is, the change in the current gain of the HBT with time, by measuring the change in the PL intensity of a semiconductor crystal substrate with time.

According to another aspect, since no other layer is formed on a layer corresponding to a base layer, it is possible to reduce the absorption of PL by other layers, resulting in measurement with sufficient intensity.

According to another aspect, it is possible to efficiently recombine electrons and holes together within a base layer, resulting in increased PL intensity.

According to another aspect, since a sample HBT device can be actually produced from a measured sample (semiconductor crystal substrate) it is possible to obtain accurate electrical information on an HBT device to be produced by using the semiconductor crystal substrate beforehand.

According to another aspect, it is possible to efficiently recombine electrons and holes together within a base layer, resulting in increased PL intensity. Furthermore, since a sample HBT device can be actually produced from a measured sample (semiconductor crystal substrate), it is possible to obtain accurate electrical information on an HBT device to be produced by using the semiconductor crystal substrate beforehand.

According to another aspect, it is possible to efficiently recombine electrons and holes together within a base layer, resulting in increased PL intensity.

According to other aspect, it is possible to determine the change in the base current of an HBT device with time, that is, the change in the current gain of the HBT device with time, by measuring the change in the intensity of PL from a p-type GaAs crystal layer doped with carbon with time.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-228514, filed on Aug. 6, 2002 including specification, claims, drawings and summary, on which the Convention priority of the present application is based, and incorporated herein by reference in its entirety.

What is claimed is:

1. A method of evaluating a crystalline semiconductor substrate which includes a collector layer, a base layer, and an emitter layer, said method comprising:
   producing a crystalline semiconductor substrate having a crystalline layer having a composition identical to that of the base layer.

2. The method of evaluating a crystalline semiconductor substrate according to claim 1, wherein said base layer is p-type GaAs containing carbon, and said crystalline semiconductor substrate includes a GaAs substrate and a p-type GaAs layer containing carbon, including irradiating said crystalline substrate with excitation light having a wavelength in a range from 300 nm to 550 nm.

3. The method of evaluating a crystalline semiconductor substrate according to claim 2, wherein said crystalline semiconductor substrate includes an undoped GaAs layer between said GaAs substrate and said p-type GaAs layer containing carbon.

4. The method of evaluating a semiconductor crystal substrate according to claim 2, wherein said crystalline semiconductor substrate includes at least one barrier layer at one side said GaAs layer containing carbon.

5. The method of evaluating a crystalline semiconductor substrate according to claim 4, wherein said barrier layer is 100 Å to 1,000 Å thick.

6. The method of evaluating a crystalline semiconductor substrate according to claim 4, wherein said barrier layer is selected from the group consisting of an InGaP layer and an AlGaAs layer.

7. The method of evaluating a crystalline semiconductor substrate according to claim 2, wherein said p-type GaAs layer containing carbon has a carrier concentration in a range from $1\times10^{18}$ cm$^{-3}$ to $1\times10^{20}$ cm$^{-3}$, and said p-type GaAs crystal layer containing carbon is 500 Å to 10,000 Å thick.

8. The method of evaluating a crystalline semiconductor substrate according to claim 1, wherein
   said base layer is a p-type GaAs layer containing carbon; and
   said crystalline semiconductor substrate includes, sequentially, a GaAs substrate and an n$^+$-type GaAs layer, an n-type GaAs layer, a p-type GaAs layer containing carbon, an n-type barrier layer, and an n-type GaAs layer, and, the method includes irradiating said crystalline substrate with excitation light having a wavelength within a range from 300 nm to 550 nm.

9. The method of evaluating a crystalline semiconductor substrate according to claim 8, wherein said n-type barrier layer has a carrier concentration in a range from $1\times10^{17}$ cm$^{-3}$ to $5\times10^{17}$ cm$^{-3}$, and said n-type barrier layer is 100 Å to 500 Å thick.

10. The method of evaluating a crystalline semiconductor substrate according to claim 8, wherein said barrier layer is selected from the group consisting of an InGaP layer and an AlGaAs layer.

11. The method of evaluating a crystalline semiconductor substrate according to claim 8, wherein said p-type GaAs layer containing carbon has a carrier concentration in a range from $1\times10^{18}$ cm$^{-3}$ to $1\times10^{20}$ cm$^{-3}$, and said p-type GaAs crystal layer containing carbon is 500 Å to 10,000 Å thick.

12. The method of evaluating a crystalline semiconductor substrate according to claim 1, wherein
   said base layer is a p-type GaAs layer containing carbon; and
   said crystalline semiconductor substrate includes, sequentially, a GaAs substrate and an n$^+$-type GaAs crystal layer, an n-type barrier layer, a p-type GaAs crystal layer containing carbon, an n-type barrier layer, and the method includes irradiating said crystalline substrate with agitation light having a wavelength within a range from 300 nm to 550 nm.

13. The method of evaluating a crystalline semiconductor substrate according to claim 12, wherein said n-type barrier layer has a carrier concentration in a range from $1\times10^{17}$ cm$^{-3}$ to $5\times10^{17}$ cm$^{-3}$, and said n-type barrier layer is 100 Å to 500 Å thick.

14. The method of evaluating a crystalline semiconductor substrate according to claim 12, wherein said barrier layer is selected from the group consisting of an InGaP layer and an AlGaAs layer.

15. The method of evaluating a crystalline semiconductor crystal substrate according to claim 12, wherein said p-type GaAs layer containing carbon has a carrier concentration in a range from $1 \times 10^{18}$ cm$^{-3}$ to $1 \times 10^{20}$ cm$^{-3}$, and said p-type GaAs layer containing carbon is 500 Å to 1,000 Å thick.

\* \* \* \* \*